United States Patent
Qi et al.

(10) Patent No.: US 10,964,756 B2
(45) Date of Patent: Mar. 30, 2021

(54) PIXEL STRUCTURE, DISPLAY PANEL AND FABRICATING METHOD THEREOF, AND DISPLAY DEVICE

(71) Applicants: Chongqing BOE Optoelectronics Technology Co., Ltd., Chongqing (CN); BOE TECHNOLOGY GROUP CO., LTD., Beijing (CN)

(72) Inventors: Zhijian Qi, Beijing (CN); Ni Yang, Beijing (CN); Yunze Li, Beijing (CN); Hengyi Xu, Beijing (CN); Cuilian Li, Beijing (CN); Xuebo Liang, Beijing (CN)

(73) Assignees: CHONGQING BOE OPTOELECTRONICS TECHNOLOGY CO., LTD., Chongqing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/423,864

(22) Filed: May 28, 2019

(65) Prior Publication Data
US 2020/0066807 A1    Feb. 27, 2020

(30) Foreign Application Priority Data

Aug. 21, 2018   (CN) .......................... 201810955498.5

(51) Int. Cl.
*H01L 27/32* (2006.01)
*H01L 51/56* (2006.01)

(52) U.S. Cl.
CPC .......... *H01L 27/3211* (2013.01); *H01L 51/56* (2013.01); *H01L 27/322* (2013.01)

(58) Field of Classification Search
CPC . H01L 27/3211; H01L 51/56; H01L 27/3225; H01L 27/326; H01L 51/5036
See application file for complete search history.

(56) References Cited

U.S. PATENT DOCUMENTS 9,247,613 B2 *  1/2016  Yang ...................... H05B 33/12
9,515,285 B2 * 12/2016  Sato ................... H01L 51/5209
(Continued)

FOREIGN PATENT DOCUMENTS

CN         102867920 A      1/2013
CN         103227189 A      7/2013
(Continued)

OTHER PUBLICATIONS

Chinese Office Action dated Nov. 1, 2019, from application No. 201810955498.5.

*Primary Examiner* — Bilkis Jahan
*Assistant Examiner* — Victor V Barzykin
(74) *Attorney, Agent, or Firm* — Thomas|Horstemeyer, LLP

(57) ABSTRACT

The present disclosure provides a pixel structure, a display panel and a fabrication method thereof, and a display device. The pixel structure includes a substrate and an inorganic photoluminescent layer formed on the substrate. The pixel structure incudes an excitation layer disposed on a side of the inorganic photoluminescent layer away from the substrate and configured to excite the inorganic photoluminescent layer to emit light. The pixel structure includes an organic light-emitting layer in the same layer as the excitation layer. A space is disposed between the organic light-emitting layer and the excitation layer. An orthographic projection of the excitation layer on the substrate overlaps at least partially an orthographic projection of the inorganic photoluminescent layer on the substrate.

18 Claims, 4 Drawing Sheets

(56) References Cited

U.S. PATENT DOCUMENTS

| | | | | |
|---|---|---|---|---|
| 10,620,478 | B2 * | 4/2020 | Chen | G02B 5/201 |
| 2006/0244372 | A1 * | 11/2006 | Mikami | H01L 27/322 |
| | | | | 313/506 |
| 2010/0127248 | A1 * | 5/2010 | Ito | H01L 27/3209 |
| | | | | 257/40 |
| 2014/0231753 | A1 * | 8/2014 | Chen | H01L 27/322 |
| | | | | 257/40 |
| 2015/0092137 | A1 | 4/2015 | Kim et al. | |
| 2017/0343859 | A1 * | 11/2017 | Chen | G02F 1/133617 |
| 2018/0083215 | A1 * | 3/2018 | Wang | H01L 51/5072 |
| 2018/0157077 | A1 * | 6/2018 | Kwon | G02F 1/133617 |
| 2018/0206299 | A1 * | 7/2018 | Chen | H01L 27/32 |

FOREIGN PATENT DOCUMENTS

| | | |
|---|---|---|
| CN | 103682115 A | 3/2014 |
| CN | 105704869 A | 6/2016 |
| CN | 107408572 A | 11/2017 |

* cited by examiner

PIXEL STRUCTURE, DISPLAY PANEL AND FABRICATING METHOD THEREOF, AND DISPLAY DEVICE

CROSS REFERENCE

This application is based upon and claims priority to Chinese Patent Application No. 201810955498.5, filed on Aug. 21, 2018, the entire contents thereof are incorporated herein by reference.

TECHNICAL FIELD

The present disclosure relates to the technical field of display, and in particular, to a pixel structure, a display panel and a fabrication method thereof, and a display device.

BACKGROUND

OLED (Organic Light-Emitting Diode) display device is a research hotspot in the field of electroluminescence display due to its improvements of self-illumination and low energy consumption. At present, the most common OLED sub-pixel independent light-emitting OLED display device generally uses an organic material as a material of the light-emitting layer. The organic material has a broad emission spectrum, so the emitted light has a low color purity. In addition, the optical properties of the organic material electrode are extremely susceptible to moisture and oxygen, so it has a poor stability, and the service life of the OLED display device is easily shortened.

SUMMARY

According to an aspect of the present disclosure, a pixel structure includes a substrate. The pixel structure includes an inorganic photoluminescent layer formed on the substrate. The pixel structure includes an excitation layer disposed on a side of the inorganic photoluminescent layer away from the substrate and configured to excite the inorganic photoluminescent layer to emit light. The pixel structure includes an organic light-emitting layer disposed in the same layer as the excitation layer. A space is disposed between the organic light-emitting layer and the excitation layer. An orthographic projection of the excitation layer on the substrate at least partially overlaps an orthographic projection of the inorganic photoluminescent layer on the substrate.

In some arrangements, the organic light-emitting layer surrounds at least three sides of the excitation layer.

In some arrangements, the organic light-emitting layer is a U-shaped structure, and the excitation layer is located in an opening of the U-shaped structure.

In some arrangements, the orthographic projection of the inorganic photoluminescent layer on the substrate is circular, which surrounds the orthographic projection of the excitation layer on the substrate.

In some arrangements, the pixel structure further includes a first electrode layer disposed on a side of the inorganic photoluminescent layer away from the substrate, and electrically contacted with the organic light-emitting layer and the excitation layer. The pixel structure further includes a second electrode layer disposed on a side of the organic light-emitting layer and the excitation layer, and electrically contacted with the organic light-emitting layer and the excitation layer.

In some arrangements, a material of the inorganic photoluminescent layer includes calcium oxynitride, magnesium oxynitride, calcium sulphide or magnesium sulphide.

In some arrangements, the inorganic photoluminescent layer has a thickness greater than or equal to 0.5 μm and less than or equal to 1 μm in a lamination direction.

In some arrangements, each edge of the inorganic photoluminescent layer has a length greater than or equal to 50 μm and less than or equal to 300 μm.

According to another aspect of the present disclosure, a display panel includes a pixel structure. The pixel structure includes a substrate. The pixel structure includes an inorganic photoluminescent layer formed on the substrate. The pixel structure includes an excitation layer disposed on a side of the inorganic photoluminescent layer away from the substrate and configured to excite the inorganic photoluminescent layer to emit light. The pixel structure includes an organic light-emitting layer disposed in the same layer as the excitation layer. A space is disposed between the organic light-emitting layer and the excitation layer. An orthographic projection of the excitation layer on the substrate at least partially overlaps an orthographic projection of the inorganic photoluminescent layer on the substrate.

In some arrangements, the display panel further includes a spacer disposed on the first electrode layer between adjacent two pixel structures.

In some arrangements, the pixel structure further includes a first electrode layer disposed on a side of the inorganic photoluminescent layer away from the substrate, and electrically contacted with the organic light-emitting layer and the excitation layer. The pixel structure further includes a second electrode layer disposed on a side of the organic light-emitting layer and the excitation layer, and electrically contacted with the organic light-emitting layer and the excitation layer.

In some arrangements, the display panel further includes an encapsulation layer encapsulating the pixel structure and the spacer.

In some arrangements, the organic light-emitting layer surrounds at least three sides of the excitation layer.

In some arrangements, the orthographic projection of the inorganic photoluminescent layer on the substrate is circular, which surrounds the orthographic projection of the excitation layer on the substrate.

In some arrangements, the organic light-emitting layer has a U-shaped structure, and the excitation layer is located in an opening of the U-shaped structure.

According to another aspect of the present disclosure, a fabrication method of a display panel includes providing a substrate. The fabrication method includes forming an inorganic photoluminescent layer on the substrate. The fabrication method includes forming an excitation layer disposed on a side of the inorganic photoluminescent layer away from the substrate and configured to excite the inorganic photoluminescent layer to emit light. The fabrication method includes forming an organic light-emitting layer disposed in the same layer as the excitation layer. A space is disposed between the organic light-emitting layer and the excitation layer. An orthographic projection of the excitation layer on the substrate at least partially overlaps an orthographic projection of the inorganic photoluminescent layer on the substrate.

In some arrangements, the fabrication method further includes forming a first electrode layer disposed on a side of the inorganic photoluminescent layer away from the substrate, and electrically contacted with the organic light-emitting layer and the excitation layer. The fabrication method further includes forming a second electrode layer disposed on a side of the organic light-emitting layer and the excitation layer, and electrically contacted with the organic light-emitting layer and the excitation layer.

In some arrangements, the fabrication method further includes forming a spacer on the first electrode layer between adjacent two pixel structures.

In some arrangements, the fabrication method further includes forming an encapsulation layer encapsulating a pixel structure composed of the inorganic photoluminescent layer, the first electrode layer, the second electrode layer, the organic light-emitting layer and the excitation layer on the substrate and the spacer.

In some arrangements, forming an organic light-emitting layer and an excitation layer on the first electrode layer includes forming the organic light-emitting layer on the first electrode layer by a first patterning process; and forming an excitation layer on the first electrode layer at a position corresponding to at least part of the inorganic photoluminescent layer by a second patterning process. The organic light-emitting layer surrounds at least three sides of the excitation layer.

In some arrangements, the organic light-emitting layer has a U-shaped structure, and the excitation layer is located in an opening of the U-shaped structure.

According to another aspect of the present disclosure, a display device includes a display panel, the display panel includes a pixel structure. The pixel structure includes a substrate. The pixel structure includes an inorganic photoluminescent layer formed on the substrate. The pixel structure includes an excitation layer disposed on a side of the inorganic photoluminescent layer away from the substrate and configured to excite the inorganic photoluminescent layer to emit light. The pixel structure includes an organic light-emitting layer disposed in the same layer as the excitation layer. A space is disposed between the organic light-emitting layer and the excitation layer. An orthographic projection of the excitation layer on the substrate at least partially overlaps an orthographic projection of the inorganic photoluminescent layer on the substrate.

10—substrate, 20—inorganic photoluminescent layer, 30—first electrode layer, 40—organic light-emitting layer, 50—excitation layer, 60—second electrode layer, 70—spacer, 80—encapsulation layer.

DETAILED DESCRIPTION

In order to make the above objects, features and advantages of the present invention more apparent and obvious, the present disclosure will be further described in detail with reference to the accompanying drawings and specific embodiments.

The present disclosure provides a pixel structure, a display panel and a fabrication method thereof, and a display device, so as to solve the problem of low color purity of light and poor stability of a light-emitting layer in an OLED display device in which an organic material is used as a light-emitting layer.

Figure 1:
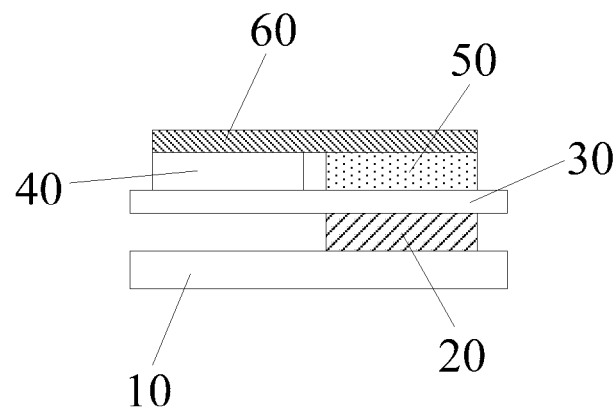
FIG. 1 is a cross-sectional schematic view showing a pixel structure of an arrangement of the present disclosure.

Referring to FIG. 1, there is shown a cross-sectional view of a pixel structure according to an arrangement of the present disclosure. The pixel structure may include a substrate 10, an inorganic photoluminescent layer 20, a first electrode layer 30, an organic light-emitting layer 40, an excitation layer 50, and a second electrode layer 60. The inorganic photoluminescent layer 20 is formed on the substrate 10. The first electrode layer 30 is overlaid on the inorganic photoluminescent layer 20. The organic light-emitting layer 40 and the excitation layer 50 are disposed on the first electrode layer 30 in the same layer (the organic light-emitting layer 40 and the excitation layer 50 are positioned on one layer, for example the first electrode layer 30). An orthographic projection of the excitation layer 50 on the substrate 10 at least partially overlaps an orthographic projection of the inorganic photoluminescent layer 20 on the substrate 10. The excitation layer 50 may be used to excite the inorganic photoluminescent layer 20 to emit light. The second electrode layer 60 is overlaid on the organic light-emitting layer 40 and the excitation layer 50.

The excitation layer 50 may be an electroluminescent material. When the first electrode layer 30 and the second electrode layer 60 are energized, the excitation layer 50 located therebetween may emit ultraviolet light, and the inorganic photoluminescent layer 20 may emit visible light of a color corresponding to the pixel to which it belongs under excitation of ultraviolet light. For example, the inorganic photoluminescent layer 20 in the red sub-pixel may emit red light under excitation of ultraviolet light, the inorganic photoluminescent layer 20 in the green sub-pixel may emit green light under excitation of ultraviolet light, and the inorganic photoluminescent layer 20 in the blue sub-pixel may emit blue light under excitation of ultraviolet light.

Since the inorganic photoluminescent material has a narrower emission spectrum compared to the organic light-emitting material, the emitted light has a high color purity, and optical properties of the inorganic photoluminescent material are not easily affected by moisture and oxygen, and thus its stability is high. Therefore, by replacing part of the organic light-emitting layer with the inorganic photoluminescent layer, the color purity of the display can be improved, and the stability of the entire light-emitting layer can be improved, thus prolonging the service life of the OLED display device.

In addition, an orthographic projection of the excitation layer 50 on the substrate 10 may completely overlap an orthographic projection of the inorganic photoluminescent layer 20 on the substrate 10, as shown in FIG. 1, i.e., an area of the excitation layer 50 may be same as an area of the inorganic photoluminescent layer 20, thus improving the excitation efficiency of the excitation layer 50. The inorganic photoluminescent layer 20 may also block the ultraviolet light emitted from the excitation layer 50 from directly emitting out of the display panel, thus avoiding damage to the human eye. Of course, in practical applications, the orthographic projection of the excitation layer 50 on the substrate 10 may also overlap the orthographic projection of the inorganic photoluminescent layer 20 on the substrate 10, i.e., the area of the excitation layer 50 may be larger than that of the inorganic photoluminescent layer 20, or the orthographic projection of the inorganic photoluminescent layer 20 on the substrate 10 may also overlap the orthographic projection of the excitation layer 50 on the substrate 10, i.e., the area of the inorganic photoluminescent layer 20 may be greater than that of the excitation layer 50, which is not specifically limited in the arrangement of the present disclosure.

In the arrangement of the present disclosure, in order to prevent the ultraviolet light emitted from the side of the excitation layer 50 entering the adjacent pixels and thus excite the inorganic photoluminescent layer 20 in the adjacent pixels to emit light and then lead to a problem of transverse crosstalk during display, the ultraviolet light emitted from the excitation layer 50 may be limited by the organic light-emitting layer 40. In practical applications, the organic light-emitting layer 40 may surround at least three sides of the excitation layer 50.

Figure 2:
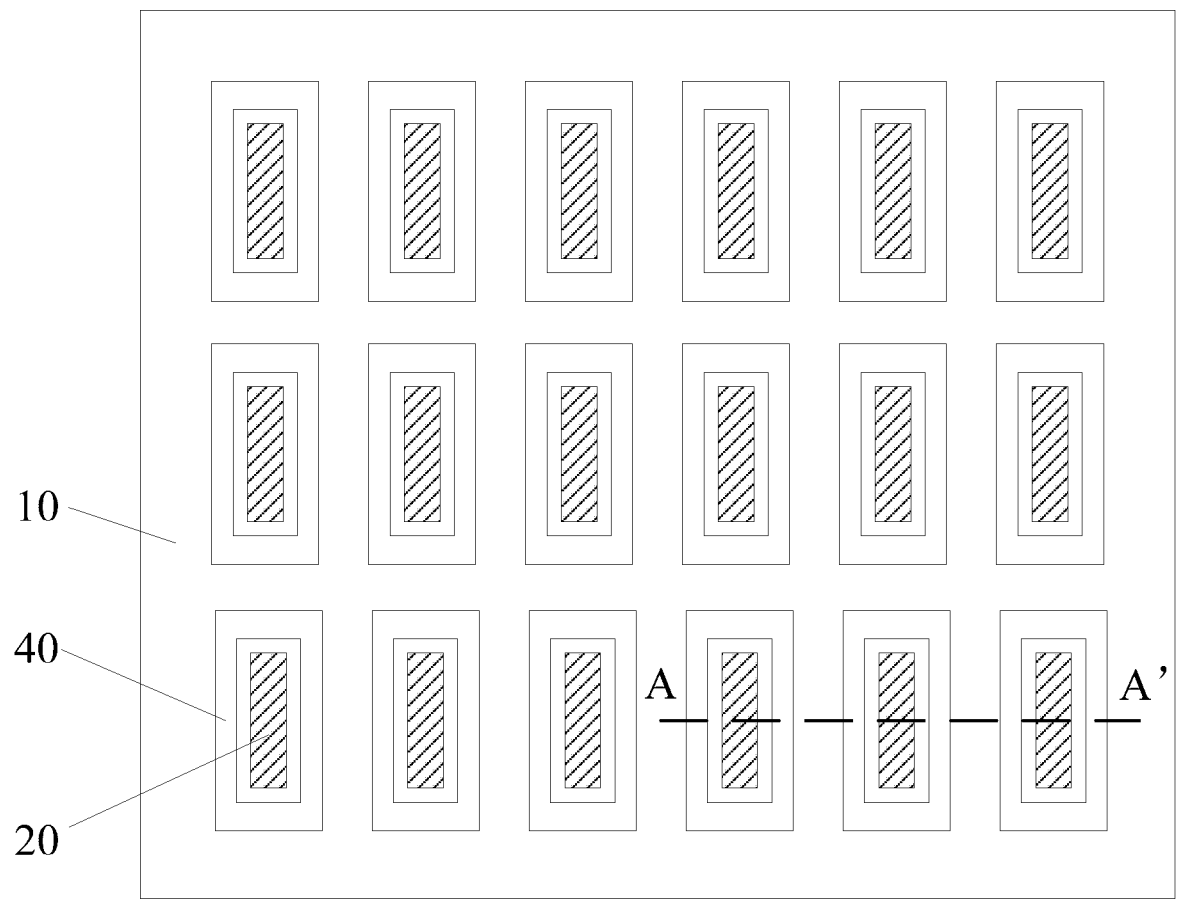
FIG. 2 is a top view showing a display panel in which an organic light-emitting layer is a frame-shaped structure according to an arrangement of the present disclosure.
Figure 3:
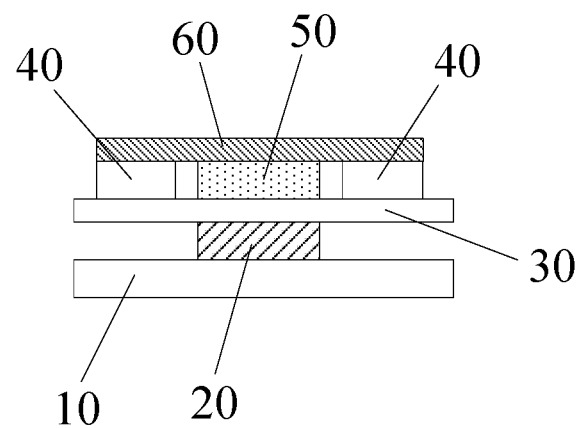
FIG. 3 is a cross-sectional schematic view showing a pixel structure in which an organic light-emitting layer is a frame-shaped structure according to an arrangement of the present disclosure.

Specifically, referring to FIG. 2, in one implementation, the organic light-emitting layer 40 may be a frame-shaped structure, and the excitation layer 50 may be located in the frame-shaped structure, so that the organic light-emitting layer 40 may surround all four sides of the excitation layer 50 inside the frame structure. Therefore, the ultraviolet light emitted from the excitation layer 50 can be prevented from entering the adjacent pixels to cause transverse interference, thus avoiding the problem of transverse crosstalk of the display panel. Correspondingly, FIG. 3 shows a cross-sectional schematic view of a pixel structure in which the organic light-emitting layer 40 is a frame-shaped structure. The organic light-emitting layer 40 may not limited to be a frame-shaped, in some implementation, the orthographic projection of the organic light-emitting layer 40 on the substrate 10 may be circular, which surrounds the orthographic projection of the excitation layer 50 on the substrate 10.

Figure 4:
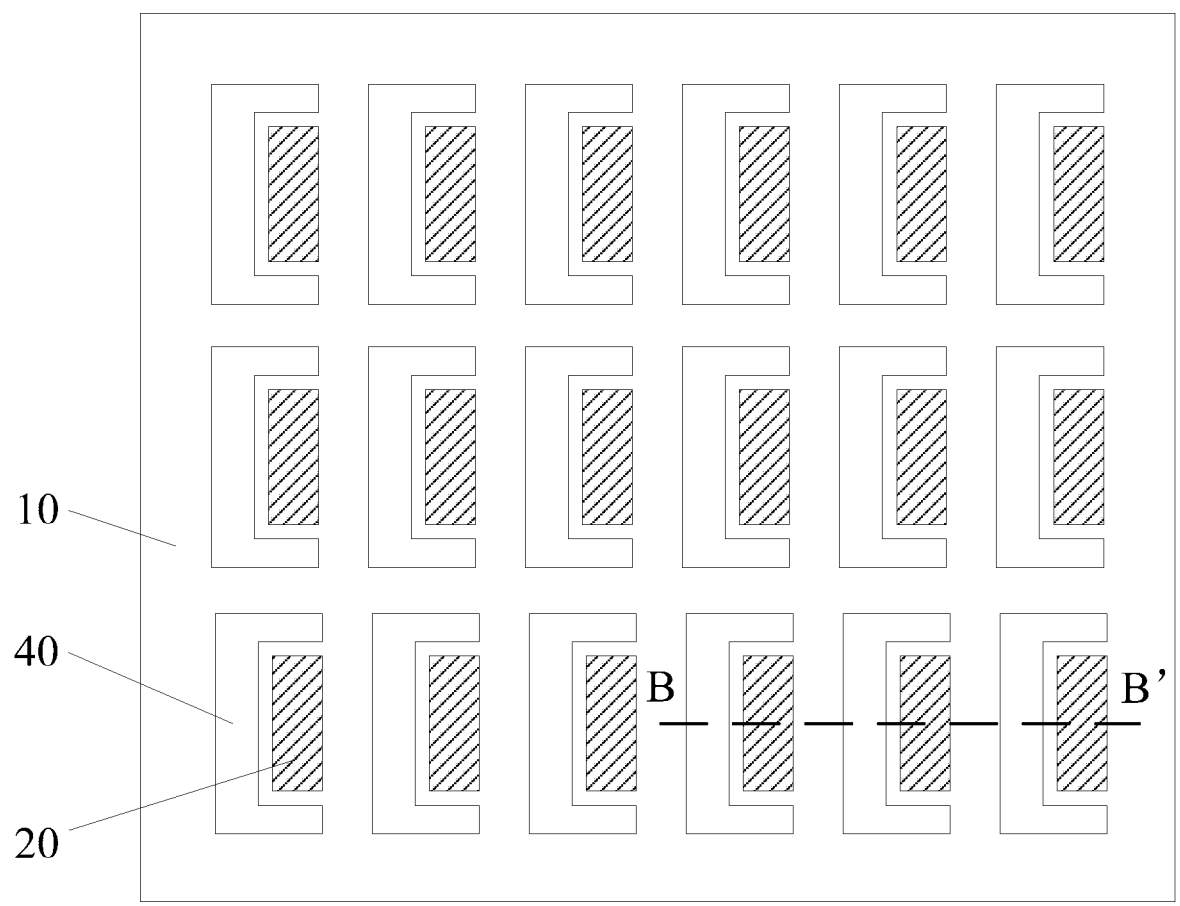
FIG. 4 is a top view of a display panel in which the organic light-emitting layer is U-shaped according to an arrangement of the present disclosure.

Referring to FIG. 4, in another implementation, the organic light-emitting layer 40 may be a U-shaped structure, and the excitation layer 50 may be located within an opening of the U-shaped structure. The organic light-emitting layer 40 may surround three sides of the excitation layer 50 in the U-shaped structure, and the ultraviolet light emitted from the other side of the excitation layer 50 may be blocked by the organic light-emitting layer 40 in the adjacent pixel in which the opening of the U-shaped structure faces. Thus, the ultraviolet light emitted by the excitation layer 50 can be prevented from exciting the inorganic photoluminescent layer 20 of the adjacent pixels, thus avoiding the problem of transverse crosstalk of the display panel. Correspondingly, FIG. 1 specifically shows a cross-sectional schematic view of a pixel structure in which the organic light-emitting layer 40 is a U-shaped structure.

It should be noted that FIG. 4 only exemplarily shows that the organic light-emitting layer 40 is a U-shaped structure with an opening to the right. In practical applications, the organic light-emitting layer 40 may also be a U-shaped structure with an opening to the left and an opening formed upwardly, and a U-shaped structure formed downwardly, which is not specifically limited in the arrangement of the present disclosure.

In practical applications, the material of the inorganic photoluminescent layer 20 may include calcium-containing nitrogen oxides, magnesium-containing nitrogen oxides, calcium-containing sulfides, or magnesium-containing sulfides and the like, and may specifically include calcium oxynitride, magnesium oxynitride, calcium sulphide or magnesium sulphide.

In actual applications, a thickness of the inorganic photoluminescent layer 20 in the stacking direction may be greater than or equal to 0.5 μm and less than or equal to 1 μm.

In addition, in actual fabrication, the shape of the inorganic photoluminescent layer 20 may be a rectangular shape, a square shape, or the like, and each side length of the inorganic photoluminescent layer 20 is greater than or equal to 50 μm and greater than or equal to 300 μm.

In an arrangement of the present disclosure, the first electrode layer 30 may be an anode layer, the material thereof may include materials such as ITO (Indium Tin Oxides), and the second electrode layer 60 may be a cathode layer, and the material thereof may include magnesium aluminum alloy, aluminum metal and other materials. In the actual application, the actual pixel structure may be different according to factors such as the type of light emitting, the driving mode, and the like. For example, the pixel structure may further include a first potential barrier buffer layer and a second potential barrier buffer layer (not shown in the arrangement of the present disclosure). The first potential barrier buffer layer may be located between the first electrode layer 30 and the organic light-emitting layer 40. The first potential barrier buffer layer may specifically include a hole injection layer and a hole transport layer for adjusting an injection velocity and an injection amount of the hole. The hole injection layer may be disposed adjacent to the first electrode layer 30. The second potential barrier buffer layer may be located between the organic light-emitting layer 40 and the second electrode layer 60, and the second potential barrier buffer layer may specifically include an electron injection layer and an electron transport layer for adjusting an injection velocity and an injection amount of electrons. The electron transport layer may be disposed adjacent to the organic light-emitting layer 40.

In an arrangement of the present disclosure, the pixel structure includes a substrate, an inorganic photoluminescent layer formed on the substrate, a first electrode layer overlaying the inorganic photoluminescent layer, an organic light-emitting layer and an excitation layer disposed on the first electrode layer in the same layer, a second electrode layer overlaying the organic light-emitting layer and the excitation layer. An orthographic projection of the excitation layer on the substrate at least partially overlaps an orthographic projection of the inorganic photoluminescent layer on the substrate, and the excitation layer is used to excite the inorganic photoluminescent layer to emit light. In an arrangement of the present disclosure, the excitation layer may emit ultraviolet light under a voltage applied by the first electrode layer and the second electrode layer, and thus the inorganic photoluminescent layer may emit light of a color corresponding to the pixel to which it belongs under excitation of ultraviolet light. Since the emission spectrum of the inorganic photoluminescent material is narrower, and the optical properties of the inorganic photoluminescent material are not easily affected by moisture and oxygen, replacing part of the organic light-emitting layer with the inorganic photoluminescent layer can improve the color purity during display, and can improve the stability of the entire light-emitting layer.

Figure 5:
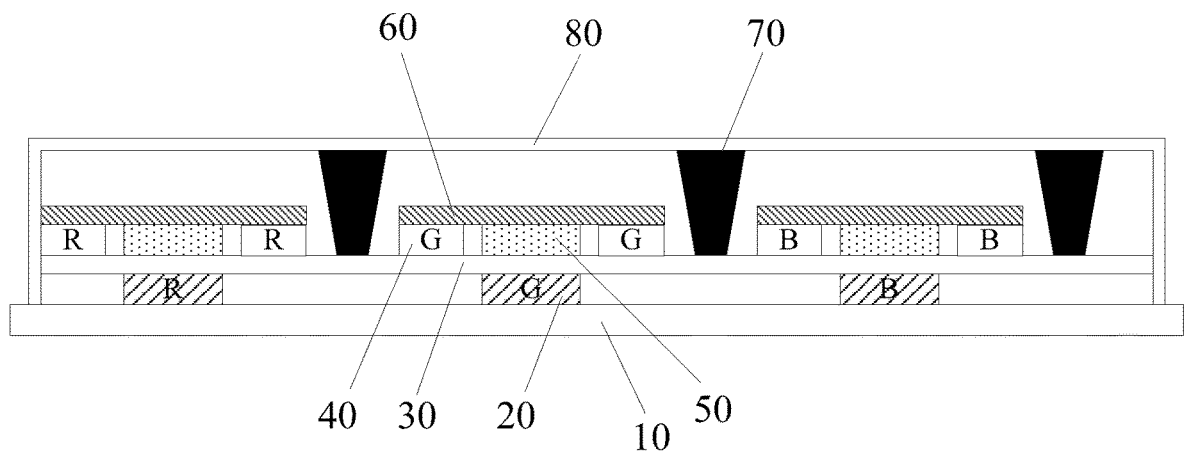
FIG. 5 is a cross-sectional schematic view showing a display panel in which an organic light-emitting layer is a frame-shaped structure according to another arrangement of the present disclosure.
Figure 6:
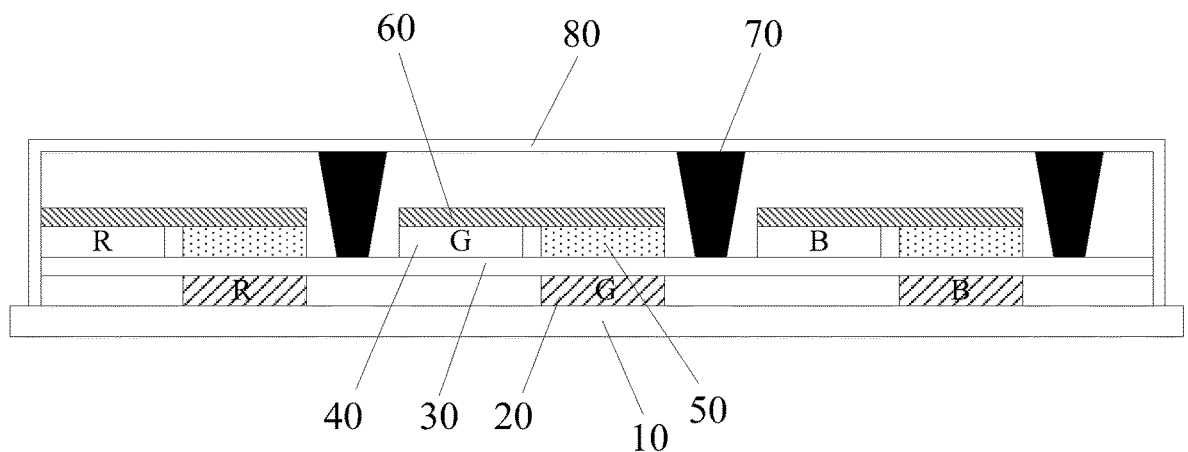
FIG. 6 is a cross-sectional schematic view showing a display panel in which an organic light-emitting layer is U-shaped according to another arrangement of the present disclosure.

Referring to FIG. 5, there is shown a cross-sectional schematic view of a display panel in which the organic light-emitting layer is a frame-shaped structure, and FIG. 5 is taken along the AA' section in FIG. 2. Referring to FIG. 6, there is shown a cross-sectional schematic view of a display panel in which the organic light-emitting layer is a U-shaped structure, and FIG. 6 is a cross-sectional view taken along BB' section in FIG. 4.

The display panel shown in FIG. 5 or FIG. 6 may include a pixel structure, and a spacer 70 and an encapsulation layer 80. The spacer 70 is located on the first electrode layer 30 between the adjacent two pixel structures, thus separating the second electrode layers 60 in the adjacent two pixel structures. The encapsulation layer 80 encapsulates the pixel structure and the spacer 70. An edge of the encapsulation layer 80 may be bonded to a substrate portion of the non-display region, so that the optical properties of the organic light-emitting layer can be prevented from being affected by moisture and oxygen.

In an arrangement of the present disclosure, the pixel structure in the display panel includes a substrate, an inorganic photoluminescent layer formed on the substrate, a first electrode layer overlaying the inorganic photoluminescent layer, an organic light-emitting layer and an excitation layer disposed on the first electrode layer in the same layer, a second electrode layer overlaying the organic light-emitting layer and the excitation layer. An orthographic projection of the excitation layer on the substrate at least partially overlaps an orthographic projection of the inorganic photoluminescent layer on the substrate, and the excitation layer is used to excite the inorganic photoluminescent layer to emit light. In an arrangement of the present disclosure, the excitation layer may emit ultraviolet light under a voltage applied by the first electrode layer and the second electrode layer, and thus the inorganic photoluminescent layer may emit light of a color corresponding to the pixel to which it belongs under excitation of ultraviolet light. Since the emission spectrum of the inorganic photoluminescent material is narrower, and the optical properties of the inorganic photoluminescent material are not easily affected by moisture and oxygen, replacing part of the organic light-emitting layer with the inorganic photoluminescent layer can improve the color purity during display, and can improve the stability of the entire light-emitting layer.

The arrangement of the present disclosure further discloses a display device including the above display panel.

Figure 7:
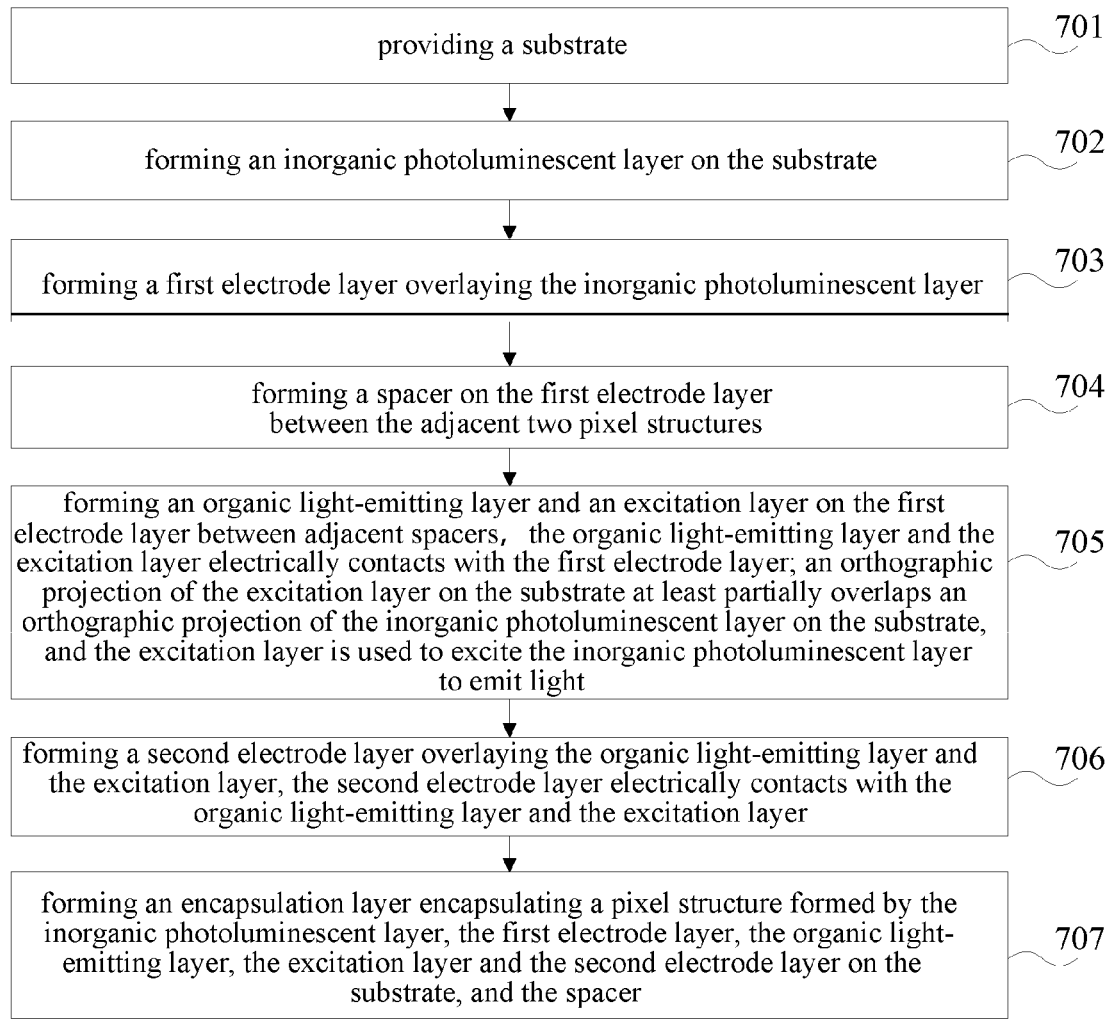
FIG. 7 is a flow chart showing a fabrication method of a display panel in another arrangement of the present disclosure.

Referring to FIG. 7, a flowchart of a fabrication method of a display panel according to another arrangement of the present disclosure is shown. The fabrication method of a display panel according to the arrangement of the present disclosure includes the following blocks:

Block 701: providing a substrate.

In the arrangement of the present disclosure, the substrate may specifically be a transparent glass substrate.

Block 702: forming an inorganic photoluminescent layer on the substrate.

In the arrangement of the present disclosure, the inorganic photoluminescent layer may be formed on the substrate by a patterning process. Specifically, the inorganic photoluminescent layer may be formed by various methods such as deposition, coating, sputtering, etc., and the patterning process generally includes processes such as photoresist coating, exposure, development, etching, photoresist stripping, and the like.

Block 703: forming a first electrode layer overlaying the inorganic photoluminescent layer.

In the arrangement of the present disclosure, the first electrode layer may be formed by a patterning process on the substrate on which the inorganic photoluminescent layer is formed, i.e., an anode layer is formed, and the first electrode layer is overlaid on the inorganic photoluminescent layer.

Block 704: forming a spacer on the first electrode layer between the adjacent two pixel structures.

In the arrangement of the present disclosure, after forming the first electrode layer, the spacer may be formed on the first electrode layer by a patterning process. In practical applications, a section of the spacer may be an inverted trapezoid, and of course, may be a rectangle or the like, which is not specifically limited in this arrangement of the present disclosure.

In one aspect, the spacer may be used to define a pixel region of each pixel structure, and can separate the second electrode layer in each pixel structure, i.e., a cathode layer, thus preventing individual sub-pixels from being common due to the cathode layer and producing interference between each other during display. On the other hand, a thickness of the spacer in the stacking direction may also be greater than a thickness of the pixel structure, so that it can be used to protect individual pixel structures in the display panel from being directly stressed.

In addition, in practical applications, the material of the spacer may be an inorganic nonmetal material.

Block 705: forming an organic light-emitting layer and an excitation layer on the first electrode layer between adjacent spacers, the organic light-emitting layer and the excitation layer electrically contacts with the first electrode layer; an orthographic projection of the excitation layer on the substrate at least partially overlaps an orthographic projection of the inorganic photoluminescent layer on the substrate, and the excitation layer is used to excite the inorganic photoluminescent layer to emit light.

In the arrangement of the present disclosure, block 705 may further include forming an organic light-emitting layer by a first patterning process on the first electrode layer between adjacent spacers; and forming an excitation layer on the first electrode layer at a position corresponding to at least part of the inorganic photoluminescent layer by a second patterning process.

The spacers may be used to define the pixel region of the respective pixel structure, so that the organic light-emitting layer may be formed on the first electrode layer between the adjacent spacers by the first patterning process, i.e., an organic light-emitting layer may be formed at the pixel region corresponding to the respective pixel, and then an excitation layer may be formed on the first electrode layer at a position corresponding to at least part of the inorganic photoluminescent layer by a second patterning process, i.e., there is a certain positive facing area between the excitation layer and the inorganic photoluminescent layer, so that the orthographic projection of the excitation layer on the substrate at least partially overlaps the orthographic projection of the inorganic photoluminescent layer on the substrate, and the excitation layer may excite the inorganic photoluminescent layer to emit light of a color corresponding to the pixel to which it belongs.

Further, the organic light-emitting layer may surround at least three sides of the excitation layer. In an implementation, the organic light-emitting layer may be a frame-shaped structure, and the excitation layer may be located in the frame-shaped structure, so that the organic light-emitting layer may completely surround all four sides of the excitation layer inside the frame-shaped structure. Thus, the ultraviolet light emitted by the excitation layer can be prevented from entering adjacent pixels to cause transverse interference, thus avoiding the problem of transverse crosstalk of the display panel.

In another implementation, the organic light-emitting layer may be a U-shaped structure, and the excitation layer may be located within an opening of the U-shaped structure. The organic light-emitting layer may surround three sides of the excitation layer in the U-shaped structure, and the ultraviolet light emitted from the other side of the excitation layer may be blocked by the organic light-emitting layer in the adjacent pixel in which the opening of the U-shaped structure faces, so that the ultraviolet light emitted by the excitation layer can be prevented from exciting the inorganic photoluminescent layer of the adjacent pixels, thus avoiding the problem of transverse crosstalk of the display panel. In the actual fabrication process, considering that the mask used in the patterning process is not high in precision, the organic light-emitting layer has a U-shaped structure, and the excitation layer located in the opening of the U-shaped structure is more easily realized in the process.

Block 706: forming a second electrode layer overlaying the organic light-emitting layer and the excitation layer, the second electrode layer electrically contacts with the organic light-emitting layer and the excitation layer.

In the arrangement of the present disclosure, after forming the organic light-emitting layer and the excitation layer, a second electrode layer overlaying the organic light-emitting layer and the excitation layer may be formed, i.e., a cathode layer is formed, so that the first electrode layer and the first electrode layer can apply a voltage to the organic light-emitting layer and the excitation layer by the first electrode layer and the second electrode layer, so that the organic light-emitting layer may emit light of a color corresponding to the pixel to which it belongs when energized, and the excitation layer may emit ultraviolet light when energized, and then the ultraviolet light may excite the inorganic photoluminescent layer to emit light of a color corresponding to the pixel to which it belongs.

Block 707: forming an encapsulation layer encapsulating a pixel structure formed by the inorganic photoluminescent layer, the first electrode layer, the organic light-emitting layer, the excitation layer and the second electrode layer on the substrate, and the spacer.

In an arrangement of the present disclosure, after forming a pixel structure formed by the inorganic photoluminescent layer, the first electrode layer, the organic light-emitting layer, the excitation layer and the second electrode layer on the substrate and a spacer, an encapsulation layer encapsulating each .pixel structure and the spacer may be formed. The edge of the encapsulation layer may be bonded to the substrate portion of the non-display region, so that the optical properties of the organic light-emitting layer can be prevented from being affected by moisture and oxygen.

In some arrangements, for example, in the case where the pixel structure does not include the second electrode layer, the implementation of the fabrication method of the display panel may omit the block 706 accordingly.

In practical applications, a desiccant may also be encapsulated in the encapsulation layer, so that the optical properties of the organic light-emitting layer can be further prevented from being affected by moisture and oxygen.

In an arrangement of the present disclosure, a substrate may be firstly provided, and then an inorganic photoluminescent layer is formed on the substrate, and then a first electrode layer overlaying the inorganic photoluminescent layer is formed. Then, a spacer is formed on the first electrode layer and an organic light-emitting layer and an excitation layer are formed on the first electrode layer between the adjacent spacers. An orthographic projection of the excitation layer on the substrate at least partially overlaps an orthographic projection of the inorganic photoluminescent layer on the substrate, the excitation layer is used to excite the inorganic photoluminescent layer to emit light, and then the second electrode layer overlaying the organic light-emitting layer and the excitation layer may be formed, followed by forming an encapsulation layer encapsulating the pixel structure and the spacer. In an arrangement of the present disclosure, the excitation layer may emit ultraviolet light under a voltage applied by the first electrode layer and the second electrode layer, and thus the inorganic photoluminescent layer may emit light of a color corresponding to the pixel to which it belongs under excitation of ultraviolet light. Since the emission spectrum of the inorganic photoluminescent material is narrower, and the optical properties of the inorganic photoluminescent material are not easily affected by moisture and oxygen, replacing part of the organic light-emitting layer with the inorganic photoluminescent layer can improve the color purity during display, and can improve the stability of the entire light-emitting layer.

With regards to the foregoing method arrangements, and for the sake of brief description, they are all described as a series of action combinations, but those skilled in the art should understand that the present disclosure is not limited by the described order of actions, as some blocks can be performed in other order or at the same time according to the present disclosure. Also, those skilled in the art should also understand that the arrangements described in the specification are all preferred arrangements, and actions and modules involved are not necessarily required by the present disclosure.

The various arrangements in the present specification are described in a progressive manner, and each arrangement focuses on differences from other arrangements, and the same or similar parts between various arrangements can be referred to each other.

Finally, it should also be noted that in this context, relational terms such as first and second are used merely to distinguish one entity or operation from another, and do not necessarily require or imply that there is any such actual relationship or order between these entities or operations. Furthermore, terms "include", "comprise" or any other variations are intended to encompass a non-exclusive inclusion, such that a process, a method, an item including a series of elements not only includes these elements, but includes other elements which are not definitely listed, or further includes elements that are inherent to such a process, a method, a commodity, or a device. Without further limitation, an element defined by the phrase "including a . . . " does not exclude other same elements present in a process, a method, an item, or a device including the element.

A pixel structure, a display panel and a fabrication method thereof, and a display device provided by the present disclosure are described in detail above. The principles and implementations of the present disclosure are described by using specific examples in the context, and the description of the above arrangements is only intended to assist in understanding the method of the present disclosure and its core idea; at the same time, for those skilled in the art, according to the idea of the present disclosure, there will be changes in the specific arrangements and application scopes. In conclusion, the contents of this specification should not be construed as limitation of the present disclosure.

What is claimed is:

1. A pixel structure, comprising:
a substrate;
an inorganic photoluminescent layer on the substrate;
an excitation layer on a side of the inorganic photoluminescent layer away from the substrate and configured to excite the inorganic photoluminescent layer to emit light; and
an organic light-emitting layer in the same layer as the excitation layer, a space between the organic light-emitting layer and the excitation layer, wherein the organic light-emitting layer surrounds at least three sides of the excitation layer,
wherein an orthographic projection of the excitation layer on the substrate overlaps, at least partially, an orthographic projection of the inorganic photoluminescent layer on the substrate.

2. The pixel structure according to claim 1, wherein the organic light-emitting layer is a U-shaped structure, and the excitation layer is in an opening of the U-shaped structure.

3. The pixel structure according to claim 1, wherein the orthographic projection of the inorganic photoluminescent layer on the substrate is circular, and the orthographic projection of the inorganic photoluminescent layer surrounds the orthographic projection of the excitation layer on the substrate.

4. The pixel structure according to claim 1, further comprising:
a first electrode layer on a side of the inorganic photoluminescent layer away from the substrate, and electrically contacted with the organic light-emitting layer and the excitation layer; and
a second electrode layer on a side of the organic light-emitting layer and the excitation layer, and electrically contacted with the organic light-emitting layer and the excitation layer.

5. The pixel structure according to claim 1, wherein a material of the inorganic photoluminescent layer comprises calcium oxynitride, magnesium oxynitride, calcium sulphide, or magnesium sulphide.

6. The pixel structure according to claim 1, wherein the inorganic photoluminescent layer has a thickness greater than or equal to 0.5 μm and less than or equal to 1 μm in a lamination direction.

7. The pixel structure according to claim 1, wherein each edge of the inorganic photoluminescent layer has a length greater than or equal to 50 μm and less than or equal to 300 μm.

8. The pixel structure according to claim 1, wherein the pixel structure is part of a display panel implemented in a display device.

9. A display panel, comprising:
a pixel structure, comprising:
a substrate;
an inorganic photoluminescent layer on the substrate;
an excitation layer on a side of the inorganic photoluminescent layer away from the substrate and configured to excite the inorganic photoluminescent layer to emit light; and
an organic light-emitting layer in the same layer as the excitation layer, a space between the organic light-emitting layer and the excitation layer, wherein the organic light-emitting layer surrounds at least three sides of the excitation layer,
wherein an orthographic projection of the excitation layer on the substrate overlaps, at least partially, an orthographic projection of the inorganic photoluminescent layer on the substrate.

10. The display panel according to claim 9, further comprising: a spacer between adjacent two pixel structures.

11. The display panel according to claim 10, further comprising: an encapsulation layer encapsulating the pixel structure and the spacer.

12. The display panel according to claim 9, wherein the orthographic projection of the inorganic photoluminescent layer on the substrate is circular, and the orthographic projection of the inorganic photoluminescent layer surrounds the orthographic projection of the excitation layer on the substrate.

13. The display panel according to claim 9, wherein the organic light-emitting layer has a U-shaped structure, and the excitation layer is in an opening of the U-shaped structure.

14. The display panel according to claim 9, wherein the pixel structure further comprises:
a first electrode layer on a side of the inorganic photoluminescent layer away from the substrate, and electrically contacted with the organic light-emitting layer and the excitation layer; and
a second electrode layer on a side of the organic light-emitting layer and the excitation layer, and electrically contacted with the organic light-emitting layer and the excitation layer.

15. A fabrication method of a display panel, comprising:
providing a substrate;
forming an inorganic photoluminescent layer on the substrate;
forming an excitation layer on a side of the inorganic photoluminescent layer away from the substrate and configured to excite the inorganic photoluminescent layer to emit light; and
forming an organic light-emitting layer in the same layer as the excitation layer, wherein a space is between the organic light-emitting layer and the excitation layer, and wherein an orthographic projection of the excitation layer on the substrate overlaps, at least partially, an orthographic projection of the inorganic photoluminescent layer on the substrate, wherein the organic light-emitting layer surrounds at least three sides of the excitation layer.

16. The fabrication method according to claim 15, further comprising:
forming a first electrode layer on a side of the inorganic photoluminescent layer away from the substrate, and electrically contacted with the organic light-emitting layer and the excitation layer; and
forming a second electrode layer on a side of the organic light-emitting layer and the excitation layer, and electrically contacted with the organic light-emitting layer and the excitation layer.

17. The fabrication method according to claim 16, further comprising: forming a spacer on the first electrode layer between adjacent two pixel structures.

18. The fabrication method according to claim 17, further comprising:
forming an encapsulation layer encapsulating a pixel structure composed of the inorganic photoluminescent layer, the first electrode layer, the second electrode layer, the organic light-emitting layer and the excitation layer on the substrate and the spacer;

wherein forming an organic light-emitting layer and an excitation layer on the first electrode layer comprises:

forming the organic light-emitting layer on the first electrode layer by a first patterning process; and forming an excitation layer on the first electrode layer at a position corresponding to at least part of the inorganic photoluminescent layer by a second patterning process.

* * * * *